United States Patent
Chan et al.

(10) Patent No.: US 6,503,848 B1
(45) Date of Patent: Jan. 7, 2003

(54) METHOD OF FORMING A SMOOTH POLYSILICON SURFACE USING A SOFT ETCH TO ENLARGE THE PHOTO LITHOGRAPHY WINDOW

(75) Inventors: Bor-Wen Chan, Hsin-Chu (TW); Yuan-Hung Chiu, Taipei (TW); Huan-Just Lin, Hsin-Chu (TW); Hun-Jan Tao, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/989,804

(22) Filed: Nov. 20, 2001

(51) Int. Cl.$^7$ ............................................. H01L 21/469
(52) U.S. Cl. ...................... 438/780; 438/699; 438/738; 438/759; 438/430
(58) Field of Search ............................. 438/697–9, 738, 438/759, 780, 430, 631, FOR 388, FOR 393, FOR 100, FOR 107, FOR 121, FOR 132, FOR 125–6

(56) References Cited

U.S. PATENT DOCUMENTS

| | | | |
|---|---|---|---|
| 4,952,274 A | 8/1990 | Abraham ..................... 156/643 |
| 5,302,551 A | 4/1994 | Iranmanesh et al. ......... 437/195 |
| 5,320,708 A | * 6/1994 | Kadomura et al. .......... 438/695 |
| 5,435,888 A | 7/1995 | Kalnitsky et al. ............. 216/18 |
| 5,500,077 A | * 3/1996 | Nishibayashi et al. ........ 216/38 |
| 5,631,197 A | 5/1997 | Yu et al. ...................... 438/699 |
| 6,037,251 A | 3/2000 | Tu et al. ...................... 438/626 |
| 6,190,949 B1 | 2/2001 | Noguchi et al. ............. 438/149 |

FOREIGN PATENT DOCUMENTS

JP  2000124457 A  *  4/2000  ........... G02F/1/136

* cited by examiner

Primary Examiner—Long Pham
Assistant Examiner—Thanh Pham
(74) Attorney, Agent, or Firm—George O. Saile; Stephen B. Ackerman; Larry J. Prescott

(57) ABSTRACT

A method is disclosed for smoothing the top surface of a layer of polysilicon which, as deposited, has a rough top surface due to the formation of polysilicon grains. A polymer, such as $C_xF_yBr_z$, is deposited using chemical vapor deposition. The polymer layer has a thickness large enough so that the top surface of the polymer is at least a critical distance above the peaks of the grains on the top surface of the layer of polysilicon. The layer of polymer and part of the layer of polysilicon are then etched away using an etch back method which etches the polymer and polysilicon at the same etch rate. This results in a layer of polysilicon having a smooth top surface and the same thickness over the entire layer of polysilicon.

21 Claims, 2 Drawing Sheets

METHOD OF FORMING A SMOOTH POLYSILICON SURFACE USING A SOFT ETCH TO ENLARGE THE PHOTO LITHOGRAPHY WINDOW

BACKGROUND OF THE INVENTION

1. Field of the Invention

This invention is related to converting a rough top surface of a layer of polysilicon, which is rough due to polysilicon grains, to a smooth top surface.

2. Description of the Prior Art

Polysilicon is a frequently used material in the fabrication of integrated circuits. Usually photolithography steps must be carried out after the layer of polysilicon has been deposited. The top surface of a layer of polysilicon will be rough due to polysilicon grains at the top surface of the layer. As critical dimensions continue to become smaller this roughness due to the polysilicon grains at the surface will impact photolithographic processing.

U.S. Pat. No. 5,631,197 to Yu et al. describes a method for forming a sacrificial planarization layer over a spin on glass layer.

U.S. Pat. No. 6,190,949 to Noguchi et al. describes a method for forming a layer of polysilicon.

U.S. Pat. No. 4,952,274 to Abraham describes a method for planarizing an insulating layer.

U.S. Pat. No. 6,037,251 to Tu et al. describes a method for intermetal dielectric planarization.

U.S. Pat. No. 5,435,888 to Kalnitsky et al. describes a method of planarizing integrated circuit topographies using a first spin-on-glass layer, a layer of low temperature oxide, and a second spin-on-glass layer.

U.S. Pat. No. 5,302,551 to Iranmanesh et al. describes a method for planarizing the surface of an integrated circuit over a metal contact layer.

SUMMARY OF THE INVENTION

The top surface of a layer of polysilicon will have a surface roughness due to the polysilicon grain size. FIG. 1 shows a layer of polysilicon 16 formed on a substrate 10 showing the rough top surface of the layer of polysilicon 16. As critical dimensions get smaller it is important to smooth the top surface of the layer of polysilicon so that subsequent photolithographic processing steps will not be affected. Anti-reflective coatings can help avoid the photolithographic problems but the anti-reflective coatings required must be thick and will affect subsequent etching steps.

The substrate 10 shown in FIG. 1 has a shallow trench filled with a first dielectric 12 formed therein for shallow trench isolation. A layer of second dielectric 14 is formed over the substrate 10 and the first dielectric 12 in the trench. The layer of polysilicon 16 is deposited on the layer of second dielectric 14. The shallow trench isolation region has slight depressions 18 at the edges of the trench. The top surface 15 of the first dielectric 12 in the trench extends a small distance above the top surface 11 of the substrate. The layer of polysilicon 16 follows the contours of the surface on which it is deposited and has substantially the same thickness over the entire layer of polysilicon.

After the top surface 19 of the layer of polysilicon has been smoothed, it is important that the remaining layer of polysilicon is substantially uniform in thickness over the entire substrate 10 and that the region of the layer of polysilicon over the first dielectric 12 in the trench is substantially the same as over the active region of the substrate 10. Any difference in thickness of the layer of polysilicon 16 can cause problems in subsequent processing steps, particularly etching steps.

It is a principal objective of at least one embodiment of this invention to provide a method of smoothing the top surface of a layer of polysilicon while maintaining the same thickness of polysilicon over the entire layer of polysilicon.

This objective is achieved by depositing a polymer, such as $C_xF_yBr_z$, having a thickness large enough so that the top surface of the polymer is at least a critical distance above the peaks of the grains on the top surface of the layer of polysilicon. The layer of polymer and part of the layer of polysilicon are then etched away using an etch back method which etches the polymer and polysilicon at the same etch rate. This results in a layer of polysilicon having a smooth top surface and the same thickness over the entire layer of polysilicon.

In one embodiment the layer of polymer has a thickness large enough so that the top surface of the polymer is more than the critical distance above the peaks of the grains on the top surface of the layer of polysilicon. In this case the polymer can be etched back so that the top surface of the polymer is at least an extended critical distance, which is greater than or equal to the critical distance, above the peaks of the grains on the top surface of the layer of polysilicon using any appropriate etching method. Then the remainder of the layer of polymer and part of the layer of polysilicon are etched away using an etch back method which etches the polymer and polysilicon at the same etch rate.

DESCRIPTION OF THE PREFERRED EMBODIMENTS

Figure 1:
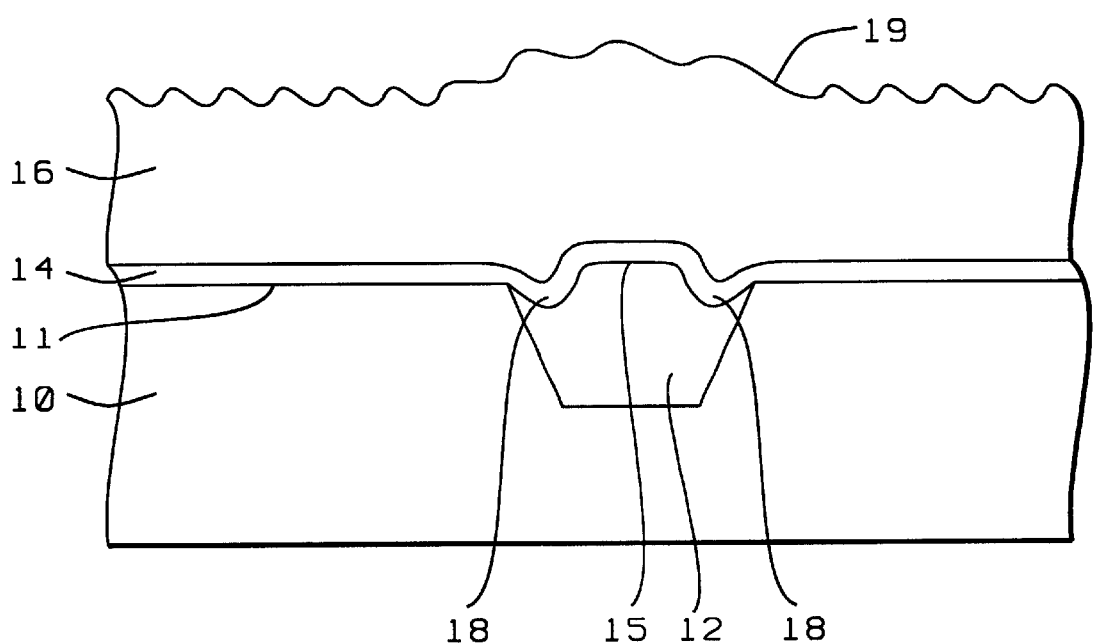
FIG. 1 shows a cross section of a substrate having shallow trench isolation formed therein and a layer of polysilicon formed thereon.

Refer now to FIGS. 1–4 for a description of the methods of this invention for achieving a smooth top surface on a layer of polysilicon. FIG. 1 shows a cross section of a substrate 10, such as a silicon substrate. Devices can be formed within the substrate and metal layers can be formed on the substrate, not shown. The substrate 10 could also be some other semiconducting material. A trench has been formed in the substrate for shallow trench isolation and is filled with a first dielectric 12 such as silicon oxide. As shown in FIG. 1, during the formation of the filled trench depressions 18 are formed at the edges of the trench. As can be seen in FIG. 1, the top 15 of the first dielectric 12 in the trench is higher than the top surface 11 of the substrate 10.

A layer of second dielectric 14, such as silicon oxide, is formed on the substrate covering the first dielectric 12 in the trench. The layer of second dielectric 14 forms a conformal layer and all of the layer of second dielectric 14 has the same thickness.

As shown in FIG. 1 a layer of polysilicon 16 is deposited on the substrate covering the layer of second dielectric 14 and the first dielectric 12 in the trench. As shown in FIG. 1, the top surface 19 of the layer of polysilicon 16 is rough because of the polylsilicon grains at the top surface 19 of the layer of polysilicon.

Figure 2:
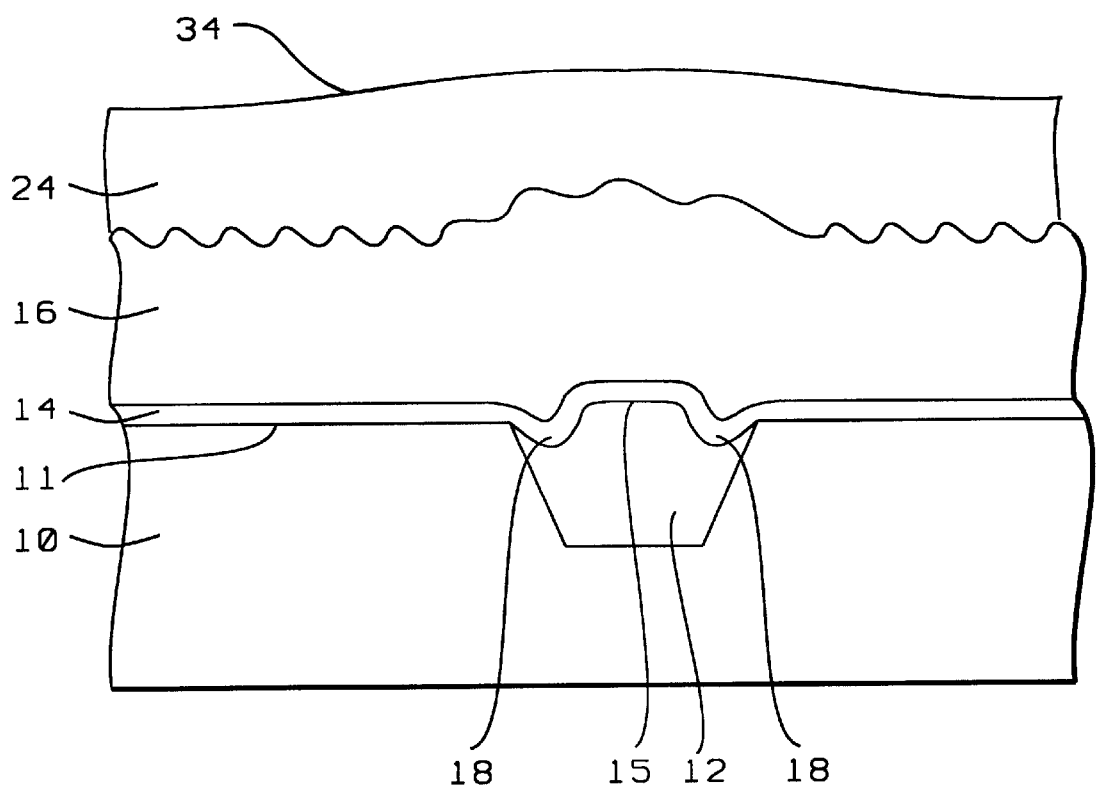
FIG. 2 shows a cross section of a substrate having shallow trench isolation formed therein, a layer of polysilicon formed thereon, and a layer of polymer deposited on the layer of polysilicon.
Figure 3:
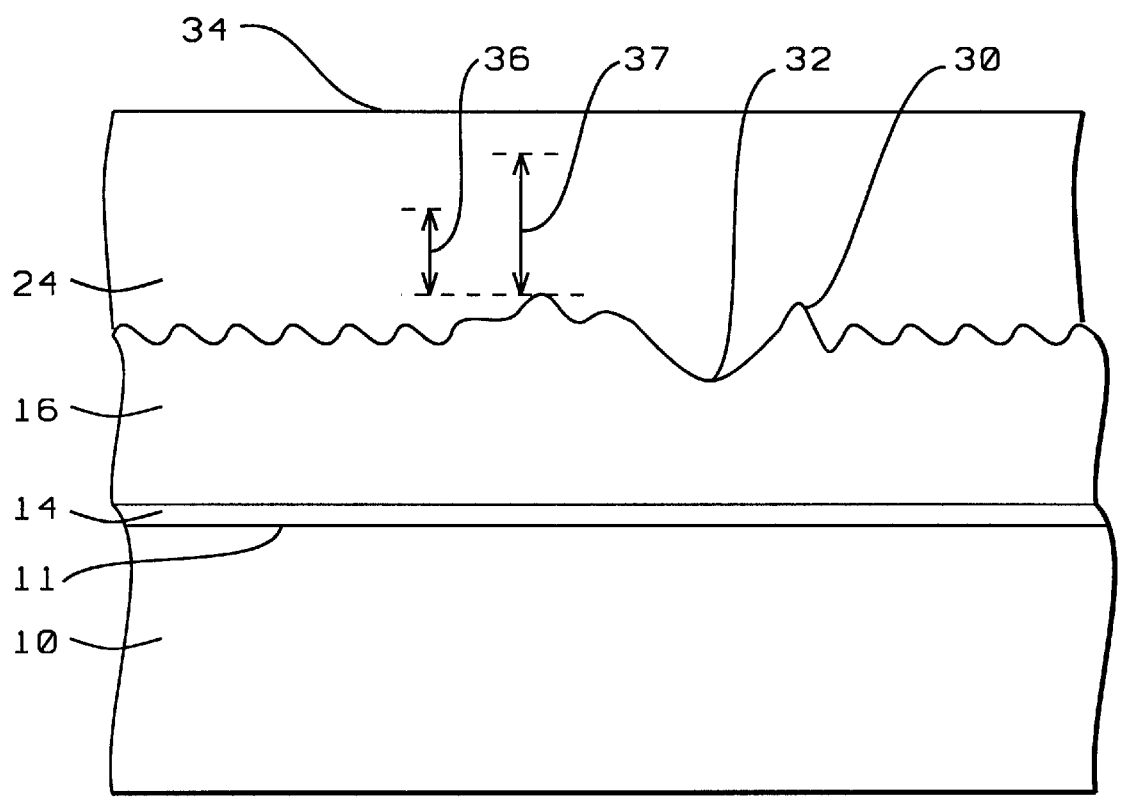
FIG. 3 shows an expanded view of a segment of the substrate in FIG. 2 showing detail of the peaks and valleys due to the polysilicon grains at the top surface of the layer of polysilicon.

As shown in FIG. 2, in order to form a smooth top surface on the layer of polysilicon 16 a layer of polymer 24 is deposited on the layer of polysilicon using chemical vapor deposition. The layer of polymer has a top surface 34 shown in FIG. 2. The polymer is deposited using a high density polymer etcher (HDP etcher) using a top power of between about 100 and 500 watts, a bottom power of between about 10 and 50 watts, a flow of $CH_2F_2$ of between about 10 and 100 sccm (standard cubic centimeters per minute), and a flow of HBr of between about 10 and 100 sccm. FIG. 3 shows an expanded view of a segment of the substrate 10 with the layer of polysilicon 16 and layer of polymer 24 deposited thereon. FIG. 3 shows that the top surface of the layer of polysilicon 16 has a number of peaks 30 and valleys 32 due to the polysilicon grains. The top surface 34 of the layer of polymer 24 must be at least a critical distance 36 above all of the peaks on the top surface of the layer of polysilicon 16. The critical distance in this example is about 200 Angstroms.

Figure 4:
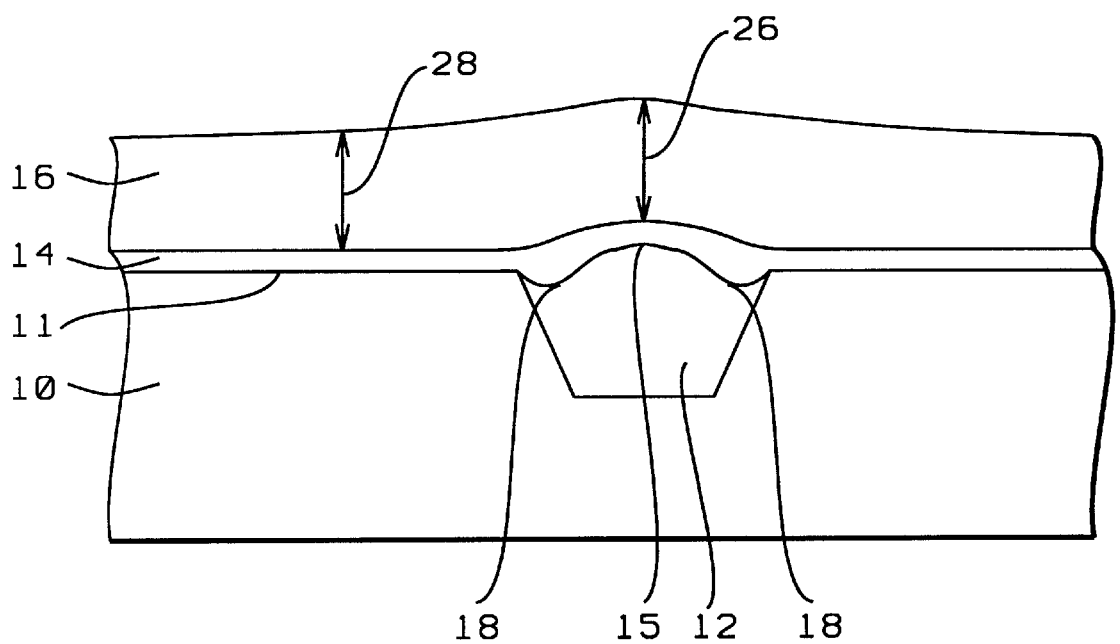
FIG. 4 shows a cross section of a substrate having shallow trench isolation formed therein and a layer of polysilicon formed thereon after the top surface of the layer of polysilicon has been smoothed using the etch back method of this invention.

Next the layer of polymer and part of the layer of polysilicon is etched away using a first etching method and first etchant wherein the ratio of the etch rate of the polymer to the etch rate of polysilicon is between about 0.9 and 1.1 and preferably 1.0. This leaves a smooth top surface on the layer of polysilicon 16, as shown in FIG. 4. This back etch also leaves a conformal layer of polysilicon 16 having a uniform thickness over the entire substrate 10 so that the distance 26 between the top surface of the layer of second dielectric 14 and the top surface of the layer of polysilicon 16 over the first dielectric 12 in the trench is the same as the distance 28 between the top surface of the layer of second dielectric 14 and the top surface of the layer of polysilicon 16 over the remaining or active areas of the substrate 10. This etching can be accomplished using a first etching method of dry anisotropic etching with a first etchant comprising $CF_4$ and $CH_2F_2$.

In another embodiment of this invention that part of the layer of polymer 24 greater than an extended critical distance 37, greater than or equal to the critical distance 36, above all of the peaks on the top surface of the layer of polysilicon 16 can be etched away using a second etching method and a second etchant, see FIG. 3. The extended critical distance 37 in this example is about 250 Angstroms. The second etching method and second etchant can be optimized for the etching of the polymer. The second etching method can be dry anisotropic etching with a second etchant comprising $CF_4$, $Cl_2$, and HBr.

After the second etching method has removed the polymer greater than an extended critical distance above all the peaks on the top surface of the layer of polysilicon 16, the remaining polymer and part of the layer of polysilicon 16 is etched away using the first etching method and first etchant, as in the preceding embodiment, wherein the ratio of the etch rate of the polymer to the etch rate of polysilicon is between about 0.9 and 1.1 and preferably 1.0. As in the preceding embodiment, this leaves a smooth top surface on the layer of polysilicon 16, as shown in FIG. 4. As in the preceding embodiment, the first etching method can be dry anisotropic etching using a first etchant comprising $CF_4$ and $CH_2F_2$. As in the preceding embodiment this back etch also leaves a conformal layer of polysilicon 16 having a uniform thickness over the entire substrate 10 so that the distance 26 between the top surface of the layer of second dielectric 14 and the top surface of the layer of polysilicon 16 over the first dielectric 12 in the trench is the same as the distance 28 between the top surface of the layer of second dielectric 14 and the top surface of the layer of polysilicon 16 over the remaining or active areas of the substrate 10.

While the invention has been particularly shown and described with reference to the preferred embodiments thereof, it will be understood by those skilled in the art that various changes in form and details may be made without departing from the spirit and scope of the invention.

What is claimed is:

1. A method of forming a smooth polysilicon layer, comprising:

providing a substrate;

depositing a layer of polysilicon having a top surface on said substrate wherein said top surface of said layer of polysilicon has polysilicon grains so that said top surface has peaks and valleys;

depositing a layer of a polymer having a top surface on said layer of polysilicon using chemical vapor deposition, wherein said top surface of said layer of said polymer is at least a first distance above the peaks of said top surface of said layer of polysilicon and said polymer is deposited using a high density polymer etcher using a top power of between about 100 and 500 watts, a bottom power of between about 10 and 50 watts, a flow of $CH_2F_2$ of between about 10 and 100 standard cubic centimeters per minute, and a flow of HBr of between about 10 and 100 standard cubic centimeters per minute;

etching away said layer of said polymer and part of said layer of polysilicon, thereby leaving a uniform thickness of said polysilicon having a smooth top surface over said substrate.

2. The method of claim 1 wherein said etching away said layer of said polymer and part of said layer of polysilicon uses an etching method and etchant wherein the ratio of the etch rate of said polymer to the etch rate of polysilicon is between about 0.9 and 1.1.

3. The method of claim 1 wherein said substrate is a semiconductor substrate having devices formed therein.

4. The method of claim 1 wherein said first distance is about 200 Angstroms.

5. The method of claim 1 wherein said polymer is $C_xF_yBr_z$.

6. The method of claim 1 wherein said etching method is dry anisotropic etching and said etchant comprises $CF_4$ and $CH_2F_2$.

7. The method of claim 1 further comprising shallow trenches formed in said substrate and filled with a dielectric material wherein said layer of polysilicon is deposited on said substrate after said trenches have said formed and filled with said dielectric material.

8. The method of claim 7 wherein said dielectric material is silicon dioxide.

9. The method of claim 1 further comprising forming a layer of oxide on said substrate before depositing said layer of polysilicon on said substrate.

10. A method of forming a smooth polysilicon layer, comprising:

providing a substrate;

depositing a layer of polysilicon having a top surface on said substrate wherein said top surface of said layer of polysilicon has polysilicon grains so that said top surface has peaks and valleys;

depositing a layer of a polymer having a top surface on said layer of polysilicon using chemical vapor deposition, wherein said top surface of said layer of said polymer is at least a first distance above said peaks of said top surface of said layer of polysilicon and said polymer is deposited using a high density polymer etcher using a top power of between about 100 and 500 watts, a bottom power of between about 10 and 50 watts, a flow of $CH_2F_2$ of between about 10 and 100 standard cubic centimeters per minute, and a flow of HBr of between about 10 and 100 standard cubic centimeters per minute;

etching away that part of said layer of polymer greater than said first distance above said peaks of said top surface of said layer of polysilicon using a first etching method and first etchant;

etching away the remainder of said layer of said polymer and part of said layer of polysilicon using a second etching method and a second etchant, after etching away said that part of said layer polymer greater than said first distance above said peaks of said top surface of said layer of polysilicon, thereby leaving a uniform thickness of said polysilicon having a smooth top surface over said substrate.

11. The method of claim 10 wherein said second etching method and said second etchant provide a ratio of the etch rate of said polymer to the etch rate of polysilicon of between about 0.9 and 1.1.

12. The method of claim 10 wherein said substrate is a semiconductor substrate having devices formed therein.

13. The method of claim 10 wherein said first distance is about 250 Angstroms.

14. The method of claim 10 wherein said polymer is $C_xF_yBr_z$.

15. The method of claim 10 wherein said first etching method is dry anisotropic etching.

16. The method of claim 10 wherein said first etchant comprises $CF_4$ and $CH_2F_2$.

17. The method of claim 10 wherein said second etching method is dry anisotropic etching.

18. The method of claim 10 wherein said second etchant comprises $CF_4$, $Cl_2$, and HBr.

19. The method of claim 10 further comprising shallow trenches formed in said substrate and filled with a dielectric material wherein said layer of polysilicon is deposited on said substrate after said trenches have said formed in said substrate and filled with said dielectric material.

20. The method of claim 19 wherein said dielectric material is silicon dioxide.

21. The method of claim 10 further comprising forming a layer of oxide on said substrate before depositing said layer of polysilicon on said substrate.

* * * * *